(12) United States Patent  (10) Patent No.: US 9,075,121 B2
Irarrazaval  (45) Date of Patent: Jul. 7, 2015

(54) SYSTEM AND METHOD FOR ROTATING ANGLE VELOCITY ENCODING, PHASE CONTRAST MAGNETIC RESONANCE IMAGING

(75) Inventor: Pablo Irarrazaval, Las Condes (CL)

(73) Assignee: WISCONSIN ALUMNI RESEARCH FOUNDATION, Madison, WI (US)

( * ) Notice: Subject to any disclaimer, the term of this patent is extended or adjusted under 35 U.S.C. 154(b) by 101 days.

(21) Appl. No.: 13/183,497

(22) Filed: Jul. 15, 2011

(65) Prior Publication Data

US 2013/0018252 A1    Jan. 17, 2013

(51) Int. Cl.
*A61B 5/05* (2006.01)
*G01R 33/563* (2006.01)
*G01R 33/48* (2006.01)

(52) U.S. Cl.
CPC ...... *G01R 33/56316* (2013.01); *G01R 33/4824* (2013.01)

(58) Field of Classification Search
CPC .............. G01R 33/56316; G01R 33/4824
See application file for complete search history.

(56) References Cited

U.S. PATENT DOCUMENTS

| 5,929,637 A * | 7/1999 | Taguchi et al. | 324/306 |
| 6,188,922 B1 * | 2/2001 | Mistretta et al. | 600/419 |
| 2003/0193336 A1 * | 10/2003 | Ehman et al. | 324/309 |
| 2006/0066306 A1 * | 3/2006 | Mistretta et al. | 324/309 |

OTHER PUBLICATIONS

Holmes et al., Three Dimensional Imaging of Ventilation Dynamics in Asthmatics Using Multi-echo Projection Acquisition with Constrained Reconstruction, Magn Reson Med. Dec. 2009 ; 62(6): 1543-1556.*
Irarrazaval, Rotating Angle Velocity Encoding Phase Contrast (Rave PC), Nov. 12, 2010, 33 pages.

* cited by examiner

*Primary Examiner* — Bo J Peng
(74) *Attorney, Agent, or Firm* — Quarles & Brady, LLP (57) ABSTRACT

A system and method is provided for performing a phase-contrast imaging process to generate an image of a subject using a magnetic resonance imaging (MRI) system. With the MRI system, a set of reference projections of a subject is acquired having both stationary spins and non-stationary spins and a set of velocity-sensitive projections is acquired from the ROI that is encoded to be velocity sensitive along multiple directions per readout. For each projection of the set of velocity-sensitive projections, directional velocity components are determined and a phase-contrast image of the ROI is generated using the set of reference projections, the set of velocity-sensitive projections, and the directional velocity components.

16 Claims, 7 Drawing Sheets

SYSTEM AND METHOD FOR ROTATING ANGLE VELOCITY ENCODING, PHASE CONTRAST MAGNETIC RESONANCE IMAGING

CROSS-REFERENCE TO RELATED APPLICATIONS

N/A

FIELD OF THE INVENTION

The invention relates to a system and method for performing magnetic resonance imaging and, more particularly, to a system and method for more efficient acquisition of multi-dimensional, phase-contrast magnetic resonance images.

BACKGROUND OF THE INVENTION

When a substance such as human tissue is subjected to a uniform magnetic field (polarizing field $B_0$), the individual magnetic moments of the nuclear spins in the tissue attempt to align with this polarizing field, but precess about it in random order at their characteristic Larmor frequency. Usually the nuclear spins are comprised of hydrogen atoms, but other NMR active nuclei are occasionally used. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$; also referred to as the radiofrequency (RF) field) which is in the x-y plane and which is near the Larmor frequency, the net aligned moment, $M_z$, may be rotated, or "tipped" into the x-y plane to produce a net transverse magnetic moment $M_t$, which is rotating, or spinning, in the x-y plane at the Larmor frequency. The practical value of this phenomenon resides in the signal which is induced by the excited spins after the excitation field $B_1$ is terminated. There are a wide variety of measurement sequences in which this nuclear magnetic resonance ("NMR") phenomenon is exploited.

When utilizing these signals to produce images, magnetic field gradients ($G_x$, $G_y$, and $G_z$) are employed. Typically, the region to be imaged experiences a sequence of measurement cycles in which these gradients vary according to the particular localization method being used. The MR signals are detected using a receiver coil. The MRI signals are then digitized and processed to reconstruct the image using one of many well-known reconstruction techniques.

Magnetic resonance angiography (MRA) and, related imaging techniques, such as perfusion imaging, use the NMR phenomenon to produce images of the human vasculature or physiological performance related to the human vasculature. There are three main categories of techniques for achieving the desired contrast for the purpose of MR angiography. The first general category is typically referred to as contrast enhanced (CE) MRA. The second general category is phase contrast (PC) MRA. The third general category is time-of-flight (TOF) or tagging-based MRA.

To perform CE MRA, which is an invasive procedure in the sense that it requires the injection of a contrast agent, such as gadolinium, into the patient prior to the magnetic resonance (MR) angiogram to enhance the diagnostic capability of the MR angiogram. While CE MRA is a highly effective means for evaluating the vascular and physiological performance, for example, by studying perfusion, the technique suffers from several additional drawbacks. Specifically, an injection must be administered and, furthermore, the contrast agent that is injected carries its own drawbacks. In particular, contrast agents, generally, carry an appreciable financial cost and, furthermore, contrast agents, such as gadolinium, have recently been shown to be causative of a debilitating and potentially fatal disorder called nephrogenic systemic fibrosis (NSF). Further still, CE MRA may not provide accurate or sufficient hemodynamic information. Insufficient hemodynamic information, among other concerns, leaves the clinician without information about velocity and flow and, thus, it is not possible to determine if a stenosis is hemodynamically significant or to asses the perfusion in a clinically useful manner.

TOF imaging techniques do not require the use of a contrast agent. Contrary to CE-MRA, which relies on the administered contrast agent to provide an increase in measured MR signal, TOF MRA relies on the inflow of blood into an imaging volume to increase the signal intensity of the vasculature as compared to the stationary background tissues. This is achieved by the application of a number of RF excitation pulses to the imaging volume that cause the magnetization of the stationary background tissues to reach a saturation value. Since inflowing blood entering the imaging volume is not exposed to the same number of RF excitation, it will provide higher MR signal intensity than the background tissue. The differences between the signal intensity of the stationary background tissues and the inflowing blood thus provide a contrast mechanism exploited by TOF MRA. However, this process provides flow and velocity information only by approximation, which makes TOF good for qualitative analysis but not for quantitative analysis. Furthermore, the potential to require repeated excitations increases the amount of RF exposure delivered to the patient, which is regulated and controlled.

Phase contrast (PC) MRA relies on a change in the phase shifts of flowing protons in a region of interest to create an image. Spins that are moving along the direction of a magnetic field gradient receive a phase shift proportional to their velocity. Specifically, in a PC MRA pulse sequence, a bear minimum of two data sets with different amounts of flow sensitivity are acquired. For multi-dimensional PC MRA studies and images, three and four sets of data must be acquired. This is usually accomplished by applying gradient pairs, which sequentially dephase and then rephase spins during the sequence. In the most simplistic case of a one-dimensional (1D) velocity study, the first data set is acquired using a "flow-compensated" pulse sequence or a pulse sequence without sensitivity to flow. The second data set is acquired using a pulse sequence including velocity encoding designed to make the acquired data sensitive to flow in a particular direction. The amount of flow sensitivity is controlled by the strength of the bipolar gradient pairs used in the pulse sequence because stationary tissue undergoes no effective phase change after the application of the two gradients, whereas the different spatial localization of flowing blood is subjected to the variation of the bipolar gradient. Accordingly, moving spins experience a phase shift. The raw data from the two data sets are subtracted to yield images that illustrate the phase change, which is proportional to spatial velocity. To perform PC MRA pulse sequences, a substantial scan time is generally required, which increases with the desired number of dimensions desired in the acquired images, and the operator must set a velocity-encoding sensitivity, which varies unpredictably depending on a variety of clinical factors.

Therefore, it would be desirable to have a system and method for MR imaging, including those suitable for MRA applications, that does not suffer from the limitations addressed above.

SUMMARY OF THE INVENTION

The present invention provides a system and method for performing phase contrast MR imaging with a substantially reduced acquisition time. Specifically, rather than performing separate acquisitions for each velocity encoding, the present invention allows multiple velocity encodings to be combined. However, since the resulting data includes an inconsistent set of Fourier slices, a reconstruction method is provided that reconciles this concern by determining the velocity components despite the combination of multiple velocity encodings per readout.

In accordance with one aspect of the invention, a method for acquiring an image of a subject using a magnetic resonance imaging (MRI) system is disclosed that includes acquiring, with the MRI system, a set of velocity-insensitive reference data of a portion of the subject having both stationary spins and non-stationary spins and acquiring, with the MRI system, a set of combined velocity-sensitive data from the portion of the subject using a pulse sequence designed to encode velocity information along multiple directions per readout. The method also includes forming a set of deconstructed velocity-sensitive data from the set of combined velocity-sensitive data by determining directional velocity components for each of the multiple directions using the reference data. The method further includes generating a map of the portion of the subject showing velocity information of the non-stationary spins using the set of deconstructed velocity-sensitive data.

In accordance with another aspect of the invention, a magnetic resonance imaging (MRI) system is disclosed that includes a magnet system configured to generate a polarizing magnetic field about at least a portion of a subject arranged in the MRI system, a plurality of gradient coils configured to apply a gradient field to the polarizing magnetic field along each of at least three directions, and a radio frequency (RF) system configured to apply an excitation field to the subject and acquire MR image data therefrom. The MRI system also includes a computer system programmed to acquire, using the RF system, a set of velocity-insensitive reference data of a portion of a subject and acquire, using the RF system, a set of combined velocity-sensitive data from the portion of the subject in the presence of velocity-encoding gradients, applied in multiple directions per readout using the plurality of gradient coils. The computer is further programmed to determine directional velocity components for each of the multiple direction to form a set of deconstructed velocity-sensitive data using at least one of the set of velocity-insensitive reference data and the set of combined velocity-sensitive data. The computer is also programmed to generate a velocity-sensitive map of the portion of the subject using the set of deconstructed velocity-sensitive data.

In accordance with yet another aspect of the invention, a method for performing a phase-contrast imaging process to generate an image of a subject using a magnetic resonance imaging (MRI) system includes acquiring, with the MRI system, a set of reference projections of a portion of the subject having both stationary spins and non-stationary spins. The method also includes acquiring, with the MRI system, a set of velocity-sensitive projections from the portion of the subject that is encoded to be velocity sensitive along multiple directions per readout. The method further includes determining, for each projection of set of velocity-sensitive projections, directional velocity components using at least one of the set of reference projections and the set of velocity-sensitive projections and generating a phase-contrast map of the portion of the subject indicating the directional velocity components.

The foregoing and other advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
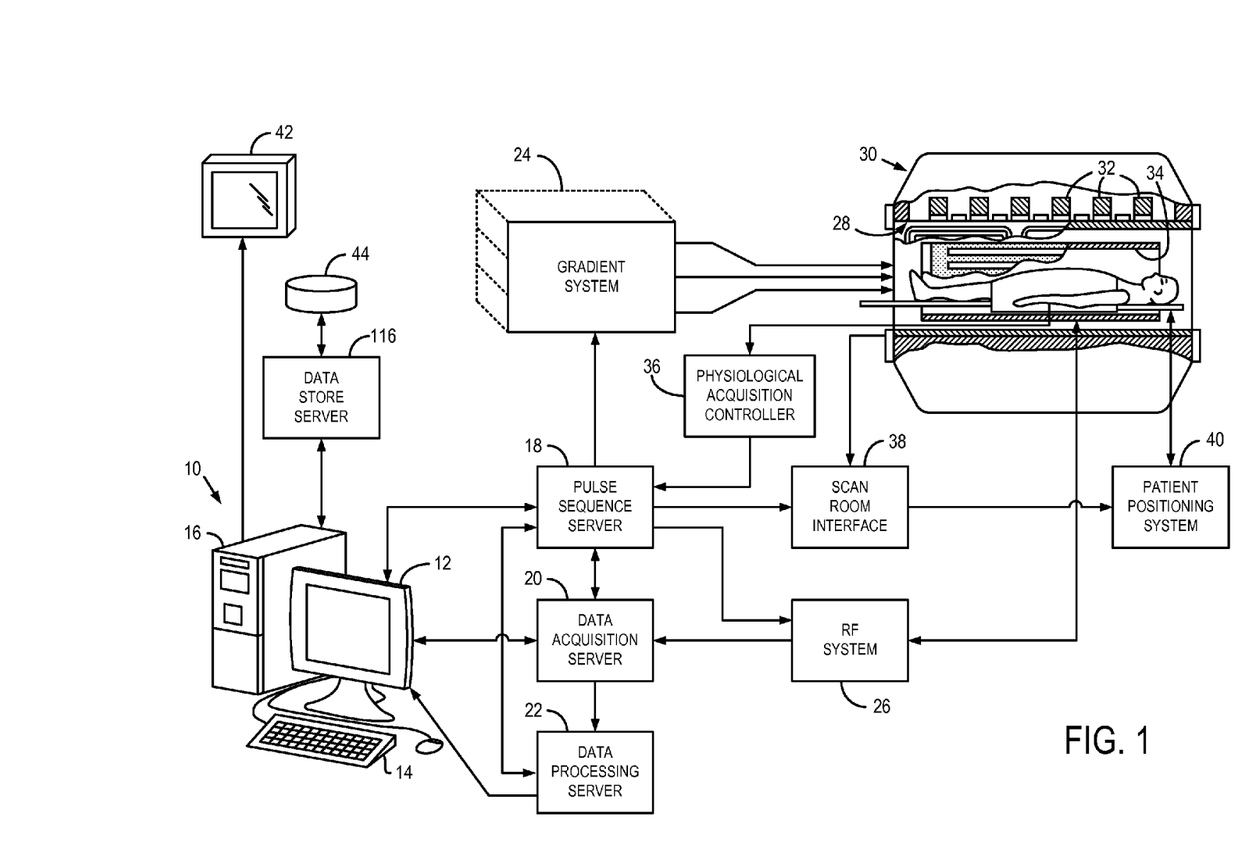
FIG. 1 is a block diagram of an MRI system for use with the present invention.

Referring particularly to FIG. 1, the invention is employed in an MRI system. The MRI system includes a workstation 10 having a display 12 and a keyboard 14. The workstation 10 includes a processor 16 that is a commercially available programmable machine running a commercially available operating system. The workstation 10 provides the operator interface that enables scan prescriptions to be entered into the MRI system.

The workstation 10 is coupled to, for example, four servers, including a pulse sequence server 18, a data acquisition server 20, a data processing server 22, and a data store server 23. In one configuration, the data store server 23 is performed by the workstation processor 16 and associated disc drive interface circuitry and the remaining three servers 18, 20, 22 are performed by separate processors mounted in a single enclosure and interconnected using a backplane bus. The pulse sequence server 18 employs a commercially available microprocessor and a commercially available communication controller. The data acquisition server 20 and data processing server 22 both employ commercially available microprocessors and the data processing server 22 further includes one or more array processors based on commercially available processors.

The workstation 10 and each processor for the servers 18, 20, 22 are connected to a communications network. This network conveys data that is downloaded to the servers 18, 20, 22 from the workstation 10 and conveys data that is communicated between the servers 18, 20, 22 and between the workstation 10 and the servers 18, 20, 22. In addition, a high speed data link is typically provided between the data processing server 22 and the workstation 10 in order to convey image data to the data store server 23.

The pulse sequence server 18 functions in response to program elements downloaded from the workstation 10 to operate a gradient system 24 and an RF system 26. Gradient waveforms necessary to perform the prescribed scan are produced and applied to the gradient system 24 that excites gradient coils in an assembly 28 to produce the magnetic field gradients $G_x$, $G_y$, and $G_z$ used for position encoding NMR signals. The gradient coil assembly 28 forms part of a magnet assembly 30, which includes a polarizing magnet 32 and a whole-body RF coil 34.

The RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered, and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase, and pulse amplitude waveform. The generated RF pulses may be applied to the whole body RF coil 34 or to one or more local coils or coil arrays.

The RF system 26 also includes one or more RF receiver channels. Each RF receiver channel includes an RF amplifier that amplifies the NMR signal received by the coil to which it is connected and a quadrature detector that detects and digitizes the in-phase (I) and quadrature (Q) components of the received NMR signal. The magnitude of the received NMR signal may thus be determined at any sampled point by the square root of the sum of the squares of the I and Q components.

The pulse sequence server 18 also optionally receives patient data from a physiological acquisition controller 36. The controller 36 receives signals from a number of different sensors connected to the patient, such as ECG signals from electrodes or respiratory signals from a bellows.

The pulse sequence server 18 also connects to a scan room interface circuit 38 that receives signals from various sensors associated with the condition of the patient and the magnet system. It is also through the scan room interface circuit 38 that a patient positioning system 40 receives commands to move the patient to desired positions during the scan.

It should be apparent that the pulse sequence server 18 performs real-time control of MRI system elements during a scan. As a result, it is necessary that its hardware elements be operated with program instructions that are executed in a timely manner by run-time programs. The description components for a scan prescription are downloaded from the workstation 10 in the form of objects. The pulse sequence server 18 contains programs that receive these objects and converts them to objects that are employed by the run-time programs.

The digitized NMR signal samples produced by the RF system 26 are received by the data acquisition server 20. The data acquisition server 20 operates in response to description components downloaded from the workstation 10 to receive the real-time NMR data and provide buffer storage such that no data is lost by data overrun. In some scans, the data acquisition server 20 does little more than pass the acquired NMR data to the data processor server 22. However, in scans that require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which k-space is sampled. Furthermore, the data acquisition server 20 may be employed to process NMR signals used to detect the arrival of contrast agent in an MRA scan. In all these examples the data acquisition server 20 acquires NMR data and processes it in real-time to produce information that is used to control the scan.

The data processing server 22 receives NMR data from the data acquisition server 20 and processes it in accordance with description components downloaded from the workstation 10. Such processing may include, for example, Fourier transformation of raw k-space NMR data to produce two or three-dimensional images, the application of filters to a reconstructed image, the performance of a backprojection image reconstruction of acquired NMR data, the calculation of functional MR images, the calculation of motion or flow images, and the like.

Images reconstructed by the data processing server 22 are conveyed back to the workstation 10 where they are stored. Real-time images are stored in a data base memory cache (not shown) from which they may be output to operator display 12 or a display 42 that is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
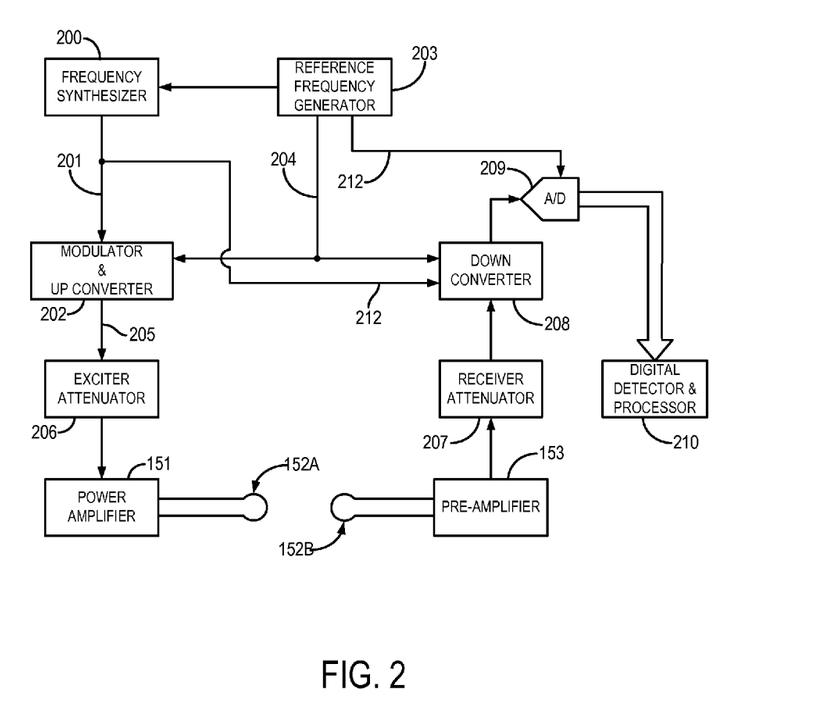
FIG. 2 is a schematic representation of a transceiver system for use with the MRI system of FIG. 1.

As shown in FIG. 1, the RF system 26 may be connected to the whole body RF coil 34, or as shown in FIG. 2, a transmitter section of the RF system 26 may connect to one RF coil 151A and its receiver section may connect to a separate RF receive coil 151B. Often, the transmitter section is connected to the whole body RF coil 34 and each receiver section is connected to a separate local coil 151B.

Referring particularly to FIG. 2, the RF system 26 includes a transmitter that produces a prescribed RF excitation field. The base, or carrier, frequency of this RF excitation field is produced under control of a frequency synthesizer 200 that receives a set of digital signals from the pulse sequence server 18. These digital signals indicate the frequency and phase of the RF carrier signal produced at an output 201. The RF carrier is applied to a modulator and up converter 202 where its amplitude is modulated in response to a signal R(t) also received from the pulse sequence server 18. The signal R(t) defines the envelope of the RF excitation pulse to be produced and is produced by sequentially reading out a series of stored digital values. These stored digital values may, be changed to enable any desired RF pulse envelope to be produced.

The magnitude of the RF excitation pulse produced at output 205 is attenuated by an exciter attenuator circuit 206 that receives a digital command from the pulse sequence server 18. The attenuated RF excitation pulses are applied to the power amplifier 151 that drives the RF coil 151A.

Referring still to FIG. 2, the signal produced by the subject is received by the receiver coil 152B and applied through a preamplifier 153 to the input of a receiver attenuator 207. The receiver attenuator 207 further amplifies the signal by an amount determined by a digital attenuation signal received from the pulse sequence server 18. The received signal is at or around the Larmor frequency, and this high frequency signal is down converted in a two step process by a down converter 208 that first mixes the NMR signal with the carrier signal on line 201 and then mixes the resulting difference signal with a reference signal on line 204. The down converted NMR signal is applied to the input of an analog-to-digital (ND) converter 209 that samples and digitizes the analog signal and applies it to a digital detector and signal processor 210 to produce the I values and Q values corresponding to the received signal. As described above, the resulting stream of digitized I and Q values of the received signal are output to the data acquisition server 20 of FIG. 1. The reference signal, as well as the sampling signal applied to the A/D converter 209, is produced by a reference frequency generator 203.

Traditional PC techniques acquire several images, including one reference image and one velocity encoded image for each velocity direction. When performing at traditional PC-based MR pulse sequence, a 2D distribution of the object intensities, which are typically complex, and a 2D distribution of the velocities in two directions must acquired.

Generally, it is customary in PC imaging to assume that there is only one velocity vector associated to each pixel. If that is not the case, traditional PC imaging techniques obtain an average velocity for that pixel. Let the object be represented by:

$$m(\vec{x}) = |m(\vec{x})| e^{i\phi(\vec{x})} \quad \text{Eqn. (1);}$$

with $\vec{x} = [x\ y\ z]$, and let its velocity, in directions x, y and z, be represented by:

$$\vec{s}(\vec{x}) = [u(\vec{x}), v(\vec{x}), w(\vec{x})] \quad \text{Eqn. (2).}$$

This object in space-velocity $(\vec{x}, \vec{s})$ is given by:

$$m(\vec{x})\delta(\vec{s} - \vec{s}(\vec{x})) \quad \text{Eqn. (3);}$$

And the MR signal would be represented by:

$$M(t) = \int\int m(\vec{x})\delta(\vec{s} - \vec{s}(\vec{x}))e^{-i2\pi[\vec{s}\cdot\vec{k}_s(t) + \vec{x}\cdot\vec{k}_x(t)]}d\vec{s}d\vec{x} \quad \text{Eqn. (4)}$$
$$= \int m(\vec{x})e^{-i2\pi[\vec{s}(\vec{x})\cdot\vec{k}_s(t) + \vec{x}\cdot\vec{k}_x(t)]}d\vec{x};$$

with:

$$\vec{k}_x(t) = \frac{\gamma}{2\pi}\int_0^t \vec{G}(\tau)d\tau; \quad \text{Eqn. (5)}$$

and $$\vec{k}_s(t) = \frac{\gamma}{2\pi}\int_0^t \tau\vec{G}(\tau)d\tau. \quad \text{Eqn. (6)}$$

Traditional PC techniques will find the object and its velocities by acquiring several images, including one reference image and one velocity encoded image for each velocity direction. Additional variants on this traditional PC technique exist where, for example, instead of acquiring one reference and one velocity encoded image for each direction, two velocity encoded images are acquired in the opposite directions. However, when performing traditional PC imaging in two dimensions, three acquisitions are required.

Figure 3A:
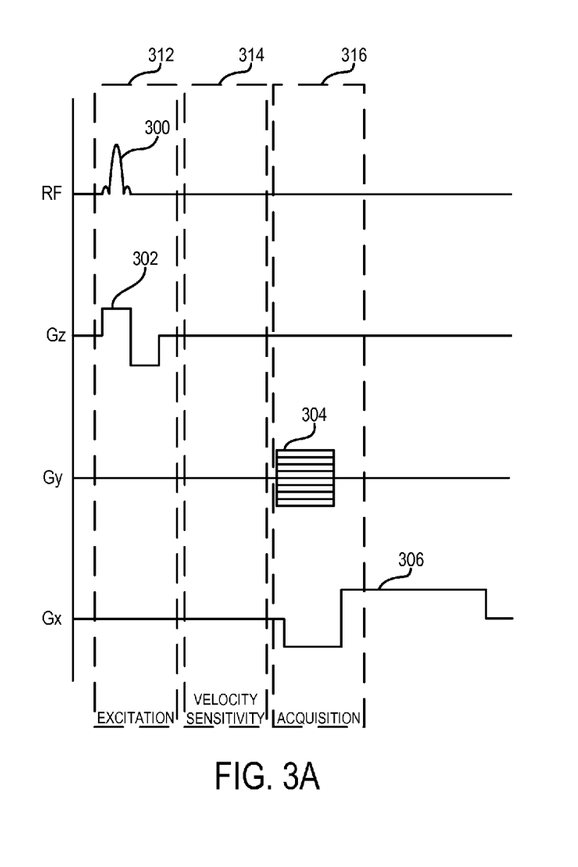
FIGS. 3A and 3B are diagrams illustrating pulse sequences for use in performing a phase contrast imaging process.
Figure 3B:
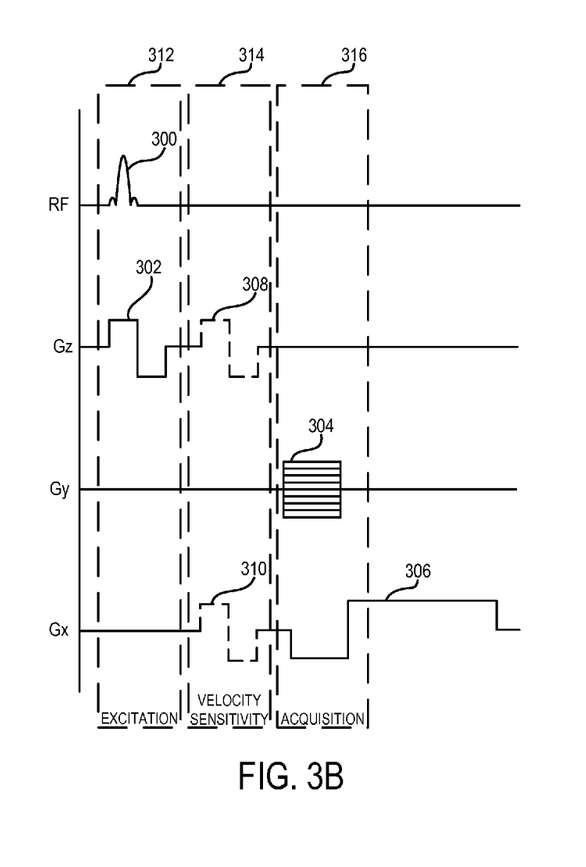

Specifically, referring to FIGS. 3A and 3B, as described above, traditional PC imaging methods require at least two data sets with a different amounts of flow sensitivity to be acquired. The first data set is often referred to as a "reference data set" and is acquired using a "flow-compensated" pulse sequence or a pulse sequence without sensitivity to flow. Specifically, referring to FIG. 3A, a basic pulse sequence diagram is illustrated that includes the application of an excitation pulse 300 in the presence of a slice-select gradient 302, illustrated along the z-direction. A series of phase encoding gradients 304 are illustrated along the y-direction, with readout 306 along the x-direction.

Referring to FIG. 3B, the second data set is acquired using a pulse sequence designed to be similar to the pulse sequence of FIG. 3A to allow for ready subtraction of the data sets following acquisition; however, the pulse sequence and the acquired data are designed to be sensitive to flow by a velocity encoding gradient. Thus, the pulse sequence of FIG. 3B must be repeated to acquire two sets of flow sensitive or velocity encoded data. During a first repetition, a first bipolar gradient 308 is applied along a direction of the velocity, in the illustrated example, the direction is the z-direction. During a second repetition, a second bipolar gradient 310 is applied along a second direction of the velocity, in the illustrated example, the direction is the x-direction. That is, in the present example of a two-dimensional (2D) imaging acquisition, pulse sequence of FIG. 3B is repeated multiple times so that the the bipolar gradients 308, 310 can be applied along two directions of velocity the z-direction and the x-direction.

Of course, the bipolar gradients may be applied along any of the three directions, based on clinical need and pulse sequence design and, in the case of three dimensional (3D) imaging acquisitions, may be applied along all three directions, which requires a third repetition of the pulse sequence of FIG. 3B with a bipolar gradient applied along the y-direction. For purposes of discussion hereafter with respect to 2D acquisitions, the velocity directions will be assumed to be along the x-direction and the y-direction.

As illustrated in FIGS. 3A and 3B, the pulse sequence used for traditional PC imaging techniques can be conceptualized as including three portions. Specifically, the first portion is the "excitation" portion 312, the second portion is the "velocity encoding" portion 314, and the third portion 316 is the "acquisition" portion." Accordingly, when acquiring the reference data set using the pulse sequence of FIG. 3A, no velocity encoding is applied in the so-called velocity sensitivity portion 314 and, when acquiring the flow-sensitive or velocity encoded data or using the pulse sequence of FIG. 3B, multiple phase encoding gradients must be applied during the so-called velocity sensitivity portion 314 to sensitize spins for flows in each direction desired for imaging. Thus, as will be further described, using traditional PC pulse sequences, two of the above-described bipolar gradients must be applied during the velocity sensitivity portion 314 for 2D imaging acquisitions and three of the above-described bipolar gradients must be applied during the velocity sensitivity portion 314 for 3D imaging acquisitions.

Figure 4A:
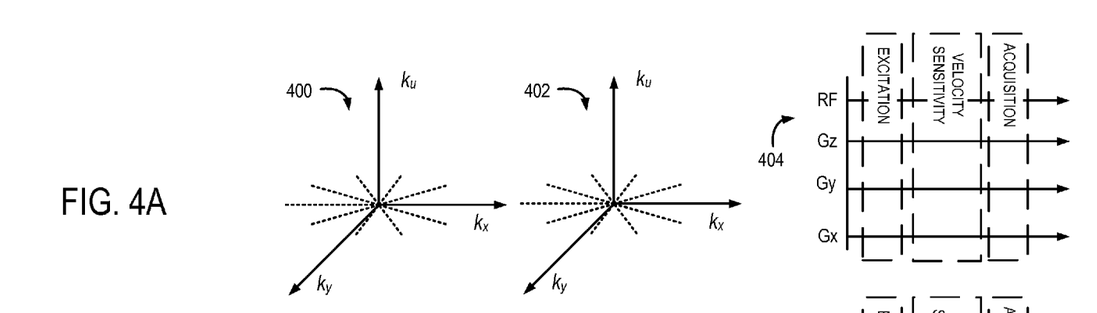
FIGS. 4A-4C are schematic diagrams illustrating k-space acquisitions employing radial trajectories and associated pulse sequences for performing a phase contrast imaging process with velocity encoding in two directions.
Figure 4B:
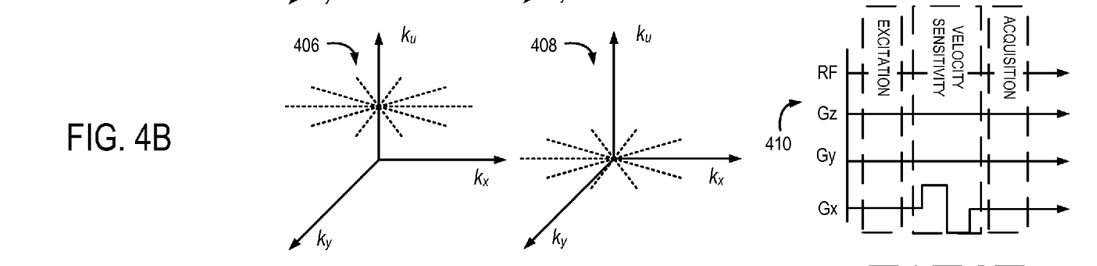
Figure 4C:
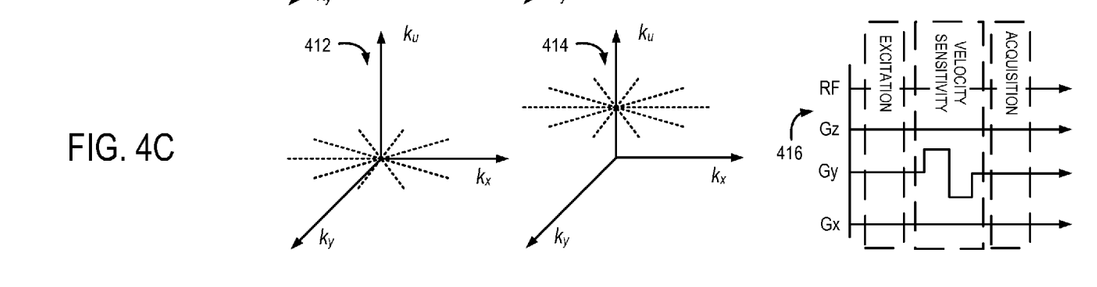

Starting first with the consideration of a 2D imaging acquisition, using traditional PC techniques, one must perform one reference acquisition ($m_o$), a first velocity acquisition in one direction (for example in the x-direction, $m_x$), and second velocity acquisition in another direction (for example in the y-direction, $m_y$). This can be represented as follows:

$$M_o(t) = \iint m(x,y)e^{-i2\pi[xk_x + yk_y]}dxdy = F\{|m_o|e^{i\phi_o}\} \quad \text{Eqn. (7);}$$

$$M_x(t) = \iint \{m(x,y)e^{-i2\pi u(x,y)k_u}e^{-i2\pi[xk_x + yk_y]} \\ dxdy = F\{|m_x|e^{i\phi_x}\} \quad \text{Eqn. (8);}$$

$$M_y(t) = \iint \{m(x,y)e^{-i2\pi v(x,y)k_v}\}e^{-2i\pi[xk_x+yk_y]} dxdy = F\{|m_y|e^{i\phi_y}\} \quad \text{Eqn. (9);}$$

where $k_u = k_u(T_u)$ and $k_v = k_v(T_v)$. That is, these integrals are computed only for the bipolar gradients (of duration $T_u$ and $T_v$) before the acquisition, which means that it is assumed, implicitly, that the first moments do not change during the data acquisition. Referring to FIGS. 4A-4C, the three acquisitions are illustrated for a radial k-space trajectory. Specifically, FIG. 4A illustrates exemplary radial k-space trajectories 400, 402 acquired using a traditional PC pulse sequence 404 that does not include velocity encoding, so as to acquire a reference data set. Accordingly, FIGS. 4B and 4C illustrate respective, exemplary radial k-space trajectories 406, 408 and 412, 414 acquired using traditional PC pulses sequences 410, 416 that include velocity encoding for u and v. Thus, each image is acquired following a trajectory in the four-dimensional space $k_x$-$k_y$-$k_u$-$k_v$ and the reconstruction is represented by:

$$\hat{m} = m_o = |m_o|e^{i\varphi_o}; \quad \text{Eqn. 10}$$

$$\hat{u} = \frac{\varphi_x - \varphi_o}{-2\pi k_u}; \quad \text{Eqn. 11}$$

$$\hat{v} = \frac{\varphi_y - \varphi_o}{-2\pi k_v}; \quad \text{Eqn. 12}$$

where $\phi_x$ and $\phi_y$ are the phases of the acquisition $m_x$ acquired with velocity encoding $k_u$ in the x-direction and of the acquisition $m_y$ acquired with velocity encoding $k_v$ in the y-direction.

Thus, using a traditional PC imaging technique for a 2D imaging acquisition, data is acquired that, as illustrated above with respect to Eqns. 7-9, can be represented in three equations. However, the number of unknown quantities within these equations is less than the number of quantities acquired with the traditional PC approach. That is, if the size of the image is N×N, the unknowns are $2N^2$ for the real and imaginary part of the object, $N^2$ for the velocity in one direction, and $N^2$ for the velocity in the other direction. In total there are $4N^2$ unknowns. However, each acquisition represents $2N^2$ equations (or $N^2$ complex equations). Accordingly, two acquisitions should yield a sufficient amount of information to reconstruct the desired images for all the unknowns.

To achieve this goal of reducing the number of acquisitions for PC imaging without sacrificing the requisite data required to perform the technique, a traditional paradigm of PC imaging must be broken. Namely, separate acquisitions for each velocity encoding must be foregone in favor of simultaneously encoding two velocities in each readout. The present invention, first recognizing this opportunity for improvement over the traditional and long-accepted PC techniques, provides a system and method for modifying PC imaging such that separate acquisitions for each velocity encoding is not necessary. Specifically, the present invention recognizes that, for example, in the case of a 2D imaging acquisition, two acquisitions, instead of three, can be performed. Likewise, in the case of a 3D imaging acquisition, three acquisitions, instead of four, can be performed.

As described above, there are two dimensionalities: one for the spatial dimensions (x, y, and z) and another for the directions of the velocity (u, v, and w). Continuing with reference to the velocity directions, not the spatial directions and the example of a 2D PC imaging process, one acquisition is performed for the reference image and another acquisition is performed for encoding the phase with a combination of two velocity directions. Extended to a 3D PC imaging process, as will be explained, one acquisition is performed for the reference image and two acquisitions are performed for encoding the phase. One of the velocity encoding acquisitions uses a combination of two velocity directions and the other addresses the remaining velocity direction.

When looking to combine two velocity encoding directions, it is desirable to encode the in-plane velocities (u and v), but the present invention is more general and works with any two directions. By way of examples, the velocity components will generally be referred to as u and v, but it is recognized that the specific directional component can be arbitrary. As will be described, the combined velocity encoding is done with a bipolar gradient in a spatial direction that changes from readout to readout. As used herein, the modified PC imaging technique using combined velocity encoding directions, whereby spatial direction of the velocity encoding gradient changes from readout to readout, will be referred to as rotating angle velocity encoding (RAVE) PC imaging.

Figure 5A:
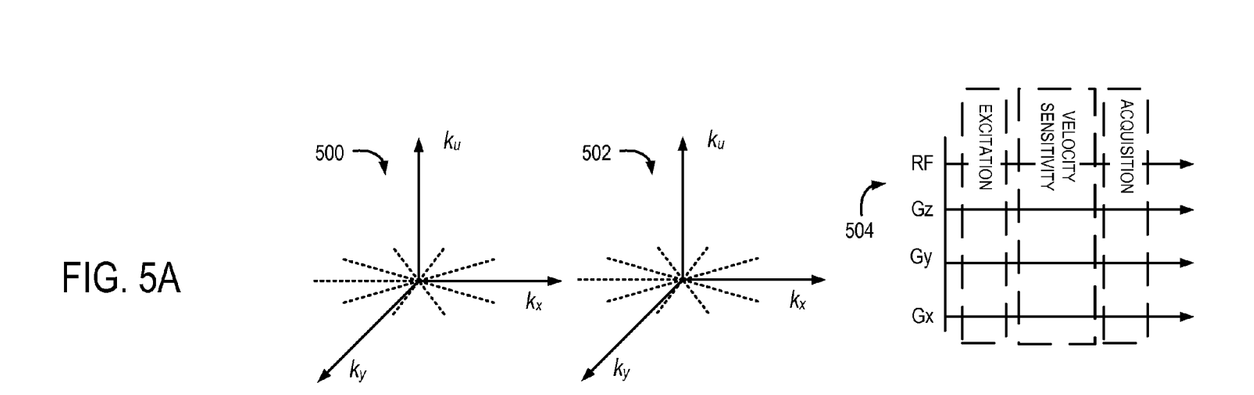
FIGS. 5A and 5B are schematic diagrams illustrating k-space acquisitions employing radial trajectories and associated pulse sequences for performing a phase contrast imaging process with velocity encoding simultaneously in two directions in accordance with the present invention.

Referring to FIG. 5A, within the context of RAVE PC imaging, a "reference data set" is acquired using radial k-space trajectories 500, 502 acquired using a reference data PC pulse sequence 504 that does not include velocity encoding. In this context, $m_0(x, y)$ represents the object reconstructed from the reference acquisition. This acquisition does not employ a bipolar gradient for encoding velocity, although one could be used to flow compensate the waveform.

Figure 5B:
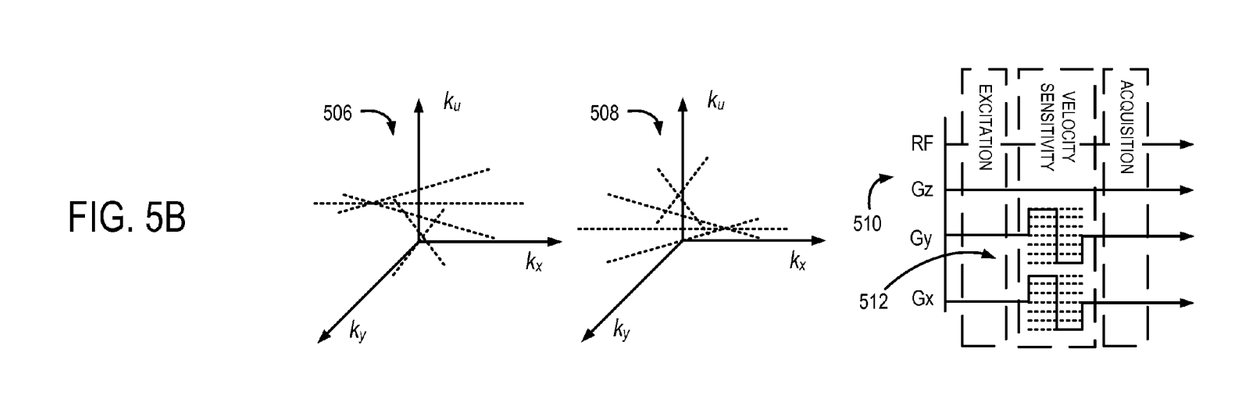

Referring to FIG. 5B, the second acquisition includes combined velocity encoding along radial k-space trajectories 506, 508, which is achieved using a multi-directional velocity encoding pulse sequence 510 that includes a bipolar gradient 512 that rotates, from readout to readout, with the encoding angle θ.

Using the combined velocity or multi-directional velocity encoding acquisition, it is not possible to reconstruct directly the acquired data from the pulse sequence 510 because the data is inconsistent. That is, each projection was acquired with a different encoding. Accordingly, a reconstruction method must be used to enable image reconstruction within the operational constraint.

The first moment of the bipolar gradients can be represented by:

$$k_u = k_r \cos \theta \quad \text{Eqn. 13; and}$$

$$k_v = k_r \sin \theta \quad \text{Eqn. 14;}$$

where θ is the encoding angle that rotates from readout to readout and $k_r$ is the absolute magnitude of the encoding (proportional to the first moment of the bipolar gradient). The acquired data with a radial k-space trajectory, also at an angle θ, is given by:

$$G_\theta(\rho) = M_\theta(\rho \cos \theta, \rho \sin \theta) \quad \text{Eqn. 15.}$$

If $M_\theta(k_x, k_y)$ is the Fourier transform of the object with velocity encoded in the direction θ, this can be rewritten as:

$$M_\theta(k_x, k_y) = \iint m(x,y)e^{-i2\pi[u(x,y)k_r \cos\theta + v(x,y)k_r \sin\theta + xk_x + yk_y]} dxdy \quad \text{Eqn. 16.}$$

In theory, the acquired data has enough information to reconstruct the unknowns u and v given that m is known from the reference image. However, as mentioned, direct reconstruction is not possible due to an inconsistent set of Fourier slices. Thus, a reconstruction process must be provided to reconstruct u and v from this set of Fourier slices of data, which are not consistent.

The following notation for the encoded object and the projection and back-projection operators is defined. Let $m_{s\theta}$ be the object with velocity s=[u, v] that was velocity encoded in the θ direction, such follows:

$$m_{s,\theta}(x,y) = m(x,y)e^{-i2\pi k_r[u(x,y)\cos\theta + v(x,y)\sin\theta]}$$ Eqn. 17.

Let $P_\theta$ be the projection operator at an angle θ, which is defined as:

$$P_\theta\{m\} = g_\theta(R) = \iint m(x,y)\delta(R - x\cos\theta - y\sin\theta)dxdy$$ Eqn. 18.

Also, let $B_\theta$ represent the back-projection operator, as follows:

$$B_\theta\{g_\theta\} = \int g_\theta(R)\delta(R - x\cos\theta - y\sin\theta)dR$$ Eqn. 19.

To enable reconstruction, the present invention looks to recover the velocity, s, from the known set of projections, $P_\theta\{m_{s,\theta}\}$, for many θ. In accordance with the present invention, an iterative algorithm can be used to modify a current estimate, $s^k$, for the velocity, s, such that the backprojected error is reduced and, ultimately, canceled.

Figure 6:
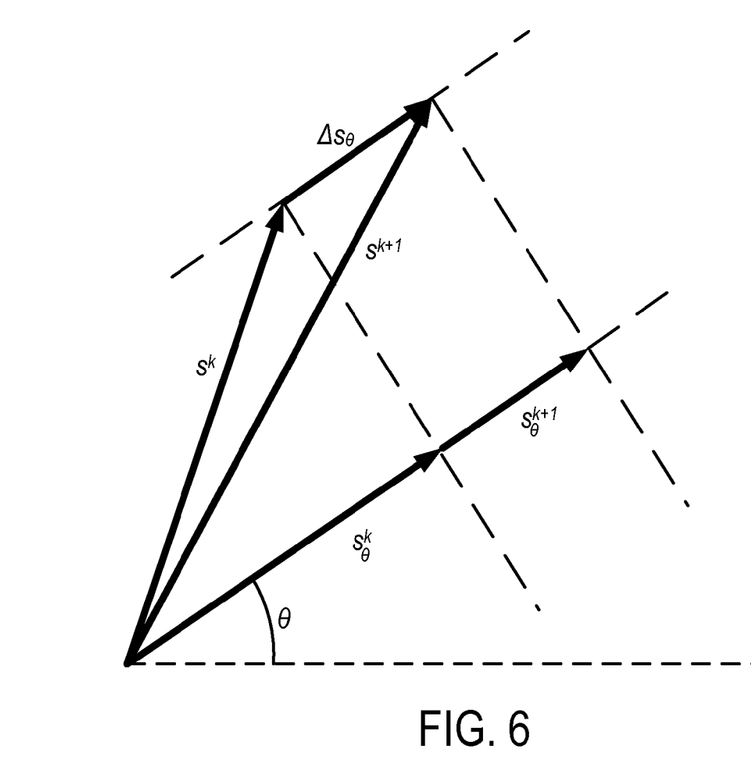
FIG. 6 is a graphic illustration of a process estimating velocities during a reconstruction process in accordance with the present invention.

Specifically, referring to FIG. 6, one step of an iterative process for updating the velocity is illustrated. In seeking the velocity, s, and controlling error in the backprojection, the process relies on an estimate, $s^k$, of the true velocity, s. The projection's error for a current estimate velocity, $s^k$, is given by:

$$P_\theta\{m_{s,\theta}\} - P_\theta\{m^k_{s,\theta}\}$$ Eqn. 20;

which backprojected is as follows:

$$e^k_\theta = B_\theta\{P_\theta\{m_{s,\theta}\} - P_\theta\{m^k_{s,\theta}\}\}$$ Eqn. 21.

Accordingly, a new velocity encoded object is given by:

$$m^{k+1}_{s,\theta} = m^k_{s,\theta} + e^k_\theta$$ Eqn. 22.

From $m^{k+1}_{s,\theta}$, an estimate can be made of the updated velocity, $s_\theta^{k+1}$, projected onto the θ-direction. Specifically, the estimate is as follows:

$$s_\theta^{k+1} = u^{k+1}\cos\theta + v^{k+1}\sin\theta = \frac{\langle m_{s^{k+1},\theta}\rangle - \langle m\rangle}{-2\pi k_r}.$$ Eqn. 23

The correction term in the θ-direction is given by $\Delta s_\theta$ as follows:

$$\Delta s_\theta = s_\theta^{k+1} - s_\theta^k = s_\theta^{k+1} - (u^k\cos\theta + v^k\sin\theta)$$ Eqn. 24;

which, as illustrated, can be selected such that $\Delta s_\theta$ and $s_\theta^{k+1}$ extend parallel to one another. Thus, the new estimates for the velocity components are as follows:

$$u^{k+1} = u^k + \Delta s_\theta \cos\theta$$ Eqn. 25; and $$v^{k+1} = v^k + \Delta s_\theta \sin\theta$$ Eqn. 26.

One iteration will be the application of Equation 23 $N_\theta$ times, one for every rotating angle. Note that the axis of rotation for the RAVE acquisition can also be x or y, in which case u and v have to be replaced with v and w or u and w.

Therefore, a reconstruction algorithm in accordance with the present invention for data acquired with RAVE PC technique relies upon an iterative process to recover the velocity of a given projection sampling in k-pace from the acquired set of projections for each θ and can be represented as follows:

$$m_{s^{k+1},\theta} = me^{-2\pi k_r[u^k\cos\theta + v^k\sin\theta]} + B_\theta\{P_\theta\{m_{s,\theta}\} - P_\theta\{m_{s^k,\theta}\}\};$$ Eqn. 27 and $$s^{k+1} = s^k + \left(\frac{\langle m_\theta^{k+1}\rangle - \langle m\rangle}{-2\pi k_r} - u^k\cos\theta - v^k\sin\theta\right)[\cos\theta, \sin\theta].$$ Eqn. 28

Again, it is noted that the axis of rotation for the RAVE acquisition can also be x or y, in which case u and v have to be replaced with v and w or u and w. Also, it is noted that each iteration must be done for different projection angles θ. However, it is noted that the convergence of the algorithm may be undesirable if the angles are processed in increasing order. For example, if the angle step is 1, it is not convenient to process the angles as (0, 1, 2, ..., 179). It is often preferable to process orthogonal projections one after the other, such as (0, 90, 1, 91, ...). Since the algorithm will cycle more than once, it is also convenient to change the order from one iteration to the other. Angles may be chosen randomly such that all the angles less than 90 are in the odd positions, and angles greater than 90 are in the even positions.

Figures 7A, 7B:
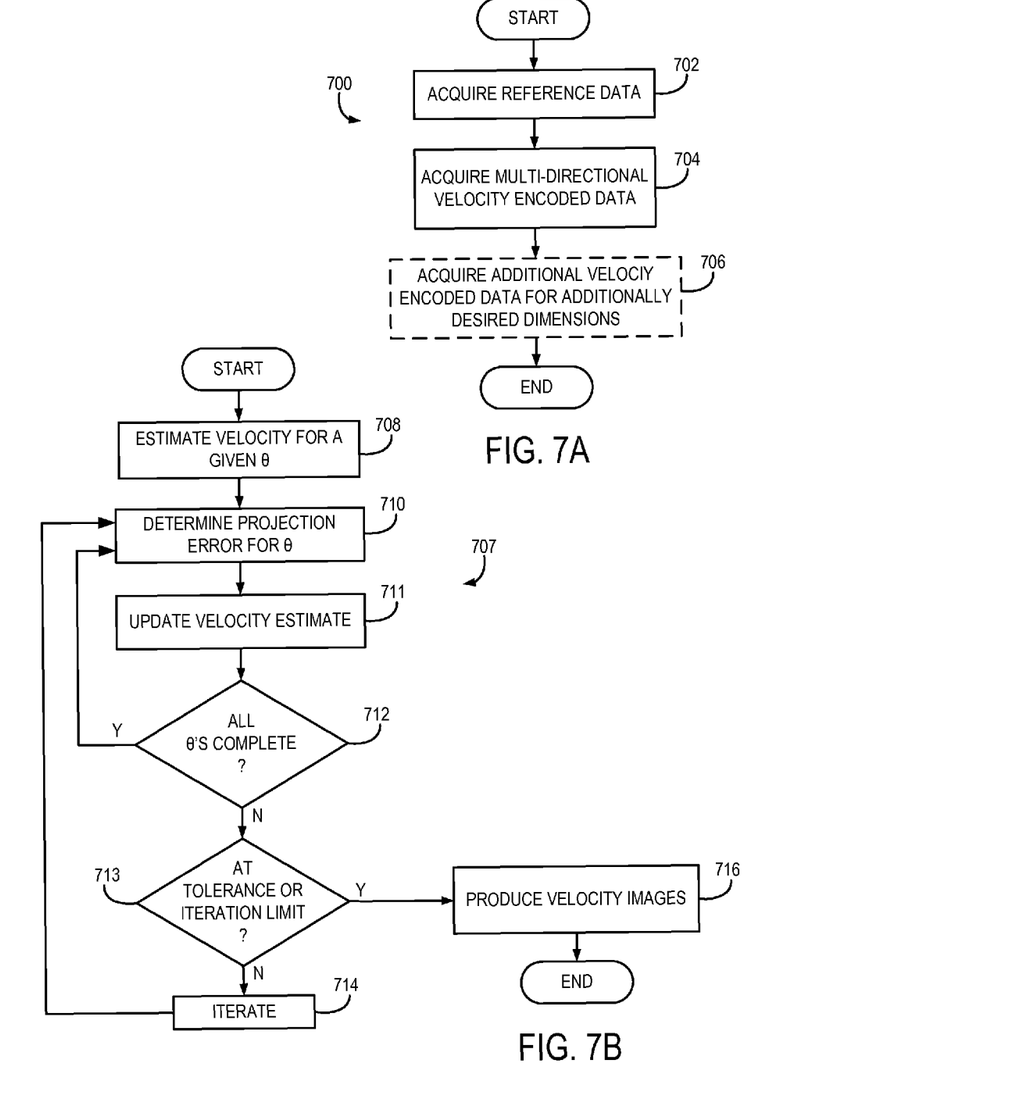
FIG. 7A is a flow chart setting forth the steps of a method of acquiring image data in accordance with the present invention.
FIG. 7B is a flow chart setting forth the steps of a method of reconstructing image data acquired using the method of FIG. 7A in accordance with the present invention.

Referring now to FIGS. 7A and 7B, the above described techniques are to be described with respect to the steps of a methodology in accordance with the present invention. Specifically, FIG. 7A provides a flow chart illustrating the steps of data acquisition. The process 700 begins at process block 702 with the acquisition of reference data from the subject having both stationary spins and non-stationary spins. As described above, the reference data is acquired using a "flow-compensated" pulse sequence or a pulse sequence without sensitivity to flow. As further described above, the acquired data is, thus velocity-insensitive reference data.

Thereafter, at process block 704, multi-directional velocity encoded data is acquired. As described above, in accordance with the present invention, multi-directional velocity encoded data may include the performance of radial acquisitions encoded simultaneously for two velocity directions in each readout. Accordingly, multi-directional velocity encoded data "combined" velocity-encoded or velocity-sensitive data because it is formed by a set of velocity-sensitive projections from the subject, each of which is encoded to be velocity sensitive along multiple directions per readout.

If more then two velocities are needed, such as in performing a 3D acquisition, at process block 706, the additional velocity encoded data for the additionally desired directions may be acquired. It is noted, however, for a 2D acquisition, process block 706 is not needed, as the requisite flow velocity encoded data for two directions is acquired during the combined, multi-directional velocity encoded data acquisition at process block 704.

Referring now to FIG. 7B, which provides a flow chart illustrating the steps of reconstruction, once the data sets are acquired, for example, as described with respect to FIG. 7A, a reconstruction process 707 may begin. The process 707 starts at process block 708, where, for the known set of projections, $P_\theta\{m_{s,\theta}\}$, an estimated velocity, $s^k$, of the true velocity, s, for a given θ is determined, as descried above with respect to FIG. 6. As further described above with respect to FIG. 6, at process block 710, the projection error is determined using the estimated velocity, $s^k$. Using this information, as described above, an updated velocity estimate is determined at process block 711 and, if an estimate velocity for all projection angles, θ, have not yet been made, at decision block 712, the process is repeated for the next angle, θ. On the other hand, if all projection angles, θ, have been completed, at decision block 713, the process determines whether an error tolerance, iteration limit, or other limit has been reached. If not, at process block 714, the processes is iterated Thus, the directional velocity components of each projection in the set of velocity-sensitive projections is determined and, in this regard, a set of deconstructed velocity-sensitive data is formed from the set of combined velocity-sensitive data formed by the projections.

This iterative process continues until, at decision blocks 712 and 713, an estimate velocity for all angles, θ, have been made and the error is within a tolerance/an iteration limit has been reached. With the requisite velocity information determined, the desired phase-contrast or velocity reports can be produced at process block 716. Specifically, a phase-contrast-type image of the subject can be generated using the set of reference data or projections, the set of velocity-sensitive data or projections, and the determined directional velocity components. However, the information provided need not only be communicated as a traditional "image." Rather, for example, a "map" may be provided that indicates velocity information along with spatial information, but not as correlated with traditional notions of anatomical images.

Thus, the present invention provides a system and method to obtain the information traditionally acquired for phase-contrast MR imaging using a reduced number of data acquisitions. Specifically, in the case of 2D phase-contrast imaging two acquisitions can be used to acquire the data (one reference data set and one combined velocity data set) instead of three acquisitions (one reference data set and two velocity data sets). Thus, in 2D phase-contrast imaging, a 33 percent savings is achieved. In the case of 3D imaging, a 25 percent savings is realized. That is, in 3D imaging, the present invention enables one to acquire one reference data set, one combined velocity data set covering two of the three directions, and one additional velocity data set covering the remaining direction. This is a 25 percent decrease in the requisite acquisitions compared with traditional 3D phase-contrast imaging, which requires one reference data set and three velocity data sets—one for each direction.

The present invention has been described in terms of one or more preferred embodiments, and it should be appreciated that many equivalents, alternatives, variations, and modifications, aside from those expressly stated, are possible and within the scope of the invention.

I claim:

1. A magnetic resonance imaging (MRI) system comprising:
   a magnet system configured to generate a polarizing magnetic field about at least a portion of a subject arranged in the MRI system;
   a plurality of gradient coils configured to apply a gradient field to the polarizing magnetic field along each of at least three directions;
   a radio frequency (RF) system configured to apply an excitation field to the subject and acquire MR image data therefrom;
   a computer system programmed to:
      acquire, using the RF system, a set of velocity-insensitive reference data of a portion of a subject;
      apply velocity-encoding gradients in combination of multiple directions using the plurality of gradient coils;
      perform, using the RF system and during application of the velocity-encoding gradients applied in combination of multiple directions, a readout to acquire a set of combined velocity-sensitive data from the portion of the subject in the presence of velocity-encoding gradients, applied in multiple directions per readout using the plurality of gradient coils;
      determine directional velocity components for each of the multiple directions to form a set of deconstructed velocity-sensitive data using at least one of the set of velocity-insensitive reference data and the set of combined velocity-sensitive data; and
      generate a velocity-sensitive map of the portion of the subject using the deconstructed velocity-sensitive data.

2. The system of claim 1 wherein the computer is further programmed to sample k-space along radial trajectories to acquire the set of velocity-insensitive reference data and the set of velocity-sensitive data.

3. The system of claim 1 wherein the computer is further programmed to sample k-space using a series of projections to acquire the set of velocity-sensitive data and programmed to form the set of deconstructed velocity-sensitive data by determining an estimated velocity for each pixel using the set of velocity-insensitive reference data and the set of combined velocity-sensitive data.

4. The system of claim 3 wherein, to determine the estimate velocity, the computer is further programmed to perform an iterative algorithm configured to modify a current velocity estimate, $s^k$, of an actual velocity, s, such that a backprojected error associated with a given projection in the series of projections is reduced.

5. The system of claim 1 wherein the velocity-encoding gradients include a rotating bipolar gradient applied along two magnetic field gradients of the MRI system for each readout.

6. The system of claim 1 wherein the computer is further configured to sampling k-space along radial trajectories.

7. The system of claim 1 wherein to determine directional velocity components, the computer is further configured to analyze a phase associated with the set of combined velocity-sensitive data.

8. The system of claim 1 wherein the velocity-sensitive map includes an image of vascular components within the portion of the subject with stationary tissue removed.

9. A magnetic resonance imaging (MRI) system comprising:
   a magnet system configured to generate a polarizing magnetic field about at least a portion of a subject arranged in the MRI system;
   a plurality of gradient coils configured to apply a gradient field to the polarizing magnetic field along each of at least three directions;
   a radio frequency (RF) system configured to apply an excitation field to the subject and acquire MR image data therefrom;
   a computer system programmed to:
      acquire, using the RF system, a set of velocity-insensitive reference data of a portion of a subject;
      apply combined velocity-encoding gradients in at least two orthogonal directions using the plurality of gradient coils;
      perform, using the RF system and during application of the combined velocity-encoding gradients applied in the at least two orthogonal directions, a readout to acquire a set of combined velocity-sensitive data from the portion of the subject in the presence of combined velocity-encoding gradients, applied in multiple directions per readout using the plurality of gradient coils;
      determine directional velocity components for each of the multiple directions to form a set of deconstructed velocity-sensitive data using at least one of the set of velocity-insensitive reference data and the set of combined velocity-sensitive data; and generate a velocity-sensitive map of the portion of the subject using the deconstructed velocity-sensitive data.

10. The system of claim 9 wherein the computer is further programmed to sample k-space along radial trajectories to acquire the set of velocity-insensitive reference data and the set of velocity-sensitive data.

11. The system of claim 9 wherein the computer is further programmed to sample k-space using a series of projections to acquire the set of velocity-sensitive data and programmed to form the set of deconstructed velocity-sensitive data by determining an estimated velocity for each pixel using the set of velocity-insensitive reference data and the set of combined velocity-sensitive data.

12. The system of claim 11 wherein, to determine the estimate velocity, the computer is further programmed to perform an iterative algorithm configured to modify a current velocity estimate, $s^k$, of an actual velocity, s, such that a backprojected error associated with a given projection in the series of projections is reduced.

13. The system of claim 9 wherein the combined velocity-encoding gradients include a rotating bipolar gradient applied along two magnetic field gradients of the MRI system for each readout.

14. The system of claim 9 wherein the computer is further configured to sampling k-space along radial trajectories.

15. The system of claim 9 wherein to determine directional velocity components, the computer is further configured to analyze a phase associated with the set of combined velocity-sensitive data.

16. The system of claim 9 wherein the velocity-sensitive map includes an image of vascular components within the portion of the subject with stationary tissue removed.

* * * * *

UNITED STATES PATENT AND TRADEMARK OFFICE
CERTIFICATE OF CORRECTION

PATENT NO. : 9,075,121 B2  
APPLICATION NO. : 13/183497  
DATED : July 7, 2015  
INVENTOR(S) : Pablo Irarrazaval

Page 1 of 1

It is certified that error appears in the above-identified patent and that said Letters Patent is hereby corrected as shown below:

*In The Specification*

Column 7, line 10 - "(ND)", should be --A/D--

Signed and Sealed this  
Twenty-fourth Day of November, 2015

Michelle K. Lee  
*Director of the United States Patent and Trademark Office*